(12) United States Patent
Watanabe

(10) Patent No.: US 6,417,073 B2
(45) Date of Patent: Jul. 9, 2002

(54) METHOD FOR FORMING ELEMENT ISOLATING REGION

(75) Inventor: Daisuke Watanabe, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/812,876

(22) Filed: Mar. 20, 2001

(30) Foreign Application Priority Data

Mar. 21, 2000 (JP) ......................................... 2000-078773

(51) Int. Cl.⁷ ................................................ H01L 21/76
(52) U.S. Cl. ......................................... 438/424; 438/427
(58) Field of Search ................................ 438/296, 424, 438/427, 435

(56) References Cited

U.S. PATENT DOCUMENTS

| | | | | |
|---|---|---|---|---|
| 5,728,621 A | * | 3/1998 | Zheng et al. ................ | 438/427 |
| 5,872,043 A | * | 2/1999 | Chen ........................... | 438/424 |
| 5,960,299 A | * | 9/1999 | Yew et al. ................... | 438/424 |
| 6,063,689 A | * | 5/2000 | Chen et al. ................. | 438/424 |
| 6,110,795 A | * | 8/2000 | Liao ........................... | 438/424 |

FOREIGN PATENT DOCUMENTS

JP 6-61343 3/1994 ........... H01L/21/76

* cited by examiner

Primary Examiner—John F. Niebling
Assistant Examiner—David S Blum
(74) Attorney, Agent, or Firm—Hayes Soloway P.C.

(57) ABSTRACT

There is provided a method for forming a Shallow Trench Isolation (STI) easy to suppress an occurrence of the debot even when the micro-scratch is present. A silicon oxide film made of an organic Spin-On-Glass (SOG) film is formed on a surface of a silicon oxide film in which a micro-scratch is generated by Chemical Mechanical Polishing (CMP). Such anisotropic etching is conducted that an etching rate for a silicon oxide film may be equal to that for the silicon nitride film, to remove the silicon nitride film and then remove by wet etching a pad oxide film, to nevertheless prevent a debot from occurring.

22 Claims, 7 Drawing Sheets

FIG.1A
111; first silicon oxide film
105, 105, 103
107, 102, 101

FIG.1B
111a; silicon oxide film
115

FIG.1C
121a; second silicon oxide film

FIG.1D
105; trench
121aa, 111aa

FIG.1E
111ab; silicon oxide film
102, 105

FIG.1F
105; trench
107a, 111ac
101

METHOD FOR FORMING ELEMENT ISOLATING REGION

BACKGROUND OF THE INVENTION

1. Field of the Invention

The invention relates to a method for forming an element isolating region in a semiconductor device and, more particularly to, a method for forming a Shallow Trench Isolation (STI) by filling with an insulator film a shallow trench in a surface of a semiconductor substrate.

The present application claims priority of Japanese Patent Application No. 2000-078773 filed on Mar. 21, 2000, which is hereby incorporated by reference.

2. Description of the Related Art

With improvements in fine patterning of semiconductor elements formed in a semiconductor silicon substrate, it has been difficult for a method for forming element isolating regions by use of a conventional LOCal Oxidation of Silicon (LOCOS) method to form accurately an active region having a width in an order of 0.1 μm or less, thus being mainly replaced by an STI method.

FIGS. 7A to 7E are schematically cross-sectional views for illustrating conventional steps of forming an element isolating region. As can be seen from FIGS. 7A to 7E, a conventional STI is formed as follows.

First, a pad oxide film 302 is formed on a silicon substrate 301 by thermal oxidation. A silicon nitride film 303 is formed which covers the pad oxide film 302. The portions of the silicon nitride film 303 and the pad oxide film 302 which exist on a formation-reserved element isolating region are patterned sequentially by anisotropic etching. By conducting anisotropic etching on the silicon substrate 301 using the silicon nitride film 303 as a mask, shallow trenches 305 are formed in the formation-reserved element isolating region on the surface of the silicon substrate 301.

Next, a thermal oxide film 307 is formed on the surface of the trenches 305 by thermal oxidation.

High-Density Plasma-Enhanced CVD (HD-PECVD) accompanied by bias sputtering is conducted to form a silicon oxide film 311 throughout on the surface to a predetermined film thickness to thereby fill and cover the trenches 305 completely with the silicon oxide film 311 (see FIG. 7A).

Next, Chemical Mechanical Polishing (CMP) is conducted (using the silicon nitride film 303 as a stopper) on the silicon oxide film 311 until an upper surface of the silicon nitride film 303 is exposed, to leave a silicon oxide film 311a in the trenches 305 (see FIG. 7B).

Next, etching-back is conducted on the silicon oxide film 311a using buffered hydrofluoric acid (BHF) to leave a silicon oxide film 311b in the trenches 305. At this point in time, an upper surface of the silicon oxide film 311b roughly agrees in level with an upper surface of the pad oxide film 302 in level (see FIG. 7C).

Next, for example, wet etching by use of hot phosphoric acid is conducted on the silicon nitride film 303 to remove it (see FIG. 7D).

Subsequently, the silicon oxide film 311b and the pad oxide film 302 are removed by wet etching by use of hydrofluoric acid (e.g., buffered hydrofluoric acid). With this, portions of a surface of the silicon substrate 301 which are expected to be an active region (element forming region) are exposed to leave a silicon oxide film 311c in the trenches 305, thus completing the conventional STI (see FIG. 7E).

The above-mentioned conventional STI forming method, however, may generate a fine scratch (hereinafter called micro-scratch) 315 in the surface of the silicon oxide film 311a as a result of CMP conducted thereon (see FIG. 7B). The micro-scratch 315 may sometimes measure about 0.1 μm to 100 μm in length.

Further, since after the trenches 305 are formed it is difficult to avoid etching the pad oxide film 302 during cleaning before the thermal oxide film 307 is formed, an under-cut is liable to be formed at the ends of the silicon nitride film 303. Accordingly, when the silicon oxide film 311 is formed, density of the silicon oxide film 311 may decrease in vicinity of a lower edge of an end of this silicon nitride film 303, thus further generating a void (not shown).

If the silicon oxide film 311a is anisotropically etched with buffered hydrofluoric acid with a presence of the micro-scratch 315, the micro-scratch 315 expands anisotropically. When, in this case, the micro-scratch 315 comes near the lower edge of the end of the above-mentioned silicon nitride film 303, etching of the silicon oxide film 311 rapidly spreads from there as a center to all around a belonging element forming region, to form a notch shape (hereinafter called debot 316) in the silicon oxide film 311b around that element forming region (see FIG. 7C). This debot 316 further develops to provide a debot 316a during wet-etching in which the silicon oxide film 311c is left (see FIG. 7E).

Thus, the conventional STI forming method suffers from a problem that width of a specific element forming region becomes larger than its design value all over its peripheries. If a semiconductor device has MOS transistors therein, such a transistor MOS may be formed that has, for example, an extremely increased reverse narrow channel effect, thus deteriorating the electric characteristics of the MOS transistor. Also, in patterning of gate electrodes in post-steps, etch residues of a conductive film may be induced at the debot 316a.

SUMMARY OF THE INVENTION

In view of the above, it is an object of the present invention to provide a method for forming an STI to suppress an effective expansion of an element forming region. It is another object of the invention to provide a method for forming the STI easy to suppress an increase in a reverse channel effect, deterioration of electric characteristics, and induction of etch residues of gate electrodes in a post-step in some transistors in a semiconductor device containing MOS transistors. It is further another object of the invention to provide a method for forming the STI easy to suppress an occurrence of the debot even when the micro-scratch is present.

According to a first aspect of the present invention, there is provided a method for forming an element isolating region, including the steps of:

forming a pad oxide film on a surface of a silicon substrate by thermal oxidation and forming a silicon nitride film which covers the pad oxide film and then conducting anisotropic etching sequentially on portions of the silicon nitride film and the pad oxide film which exist on a formation-reserved element isolating region to then conduct anisotropic etching using the silicon nitride film as a mask in order to form a trench in a surface of the silicon substrate, thus forming a first silicon oxide film throughout on the surface by High-Density Plasma-Enhanced CVD (HD-PECVD) accompanied by bias sputtering;

conducting Chemical Mechanical Polishing (CMP) on the first silicon oxide film until a surface of the silicon nitride film is exposed;

forming by spin coating or liquid-phase deposition a second silicon oxide film which covers a surface of the silicon nitride film and a surface of the first silicon oxide film to thereby conduct heat treatment in an oxygen atmosphere, serving also to refine the second silicon oxide film;

conducting such anisotropic etching using an etching gas that an etching rate for the silicon oxide film may be equal to an etching rate for the silicon nitride film to thereby remove the second silicon oxide film in order to remove the silicon nitride film and the first silicon oxide film; and remove by wet etching the pad oxide film, and the first silicon oxide film until at least the surface of the silicon substrate is exposed.

In the foregoing first aspect, a preferable mode is one wherein the second silicon oxide film is formed by spin coating and consists of an inorganic SOG (Spin-On-Glass) film made of silicon hydride sesqui-oxide ($HSiO_{3/2}$) n as a material.

According to a second aspect of the present invention, there is provided a method for forming an element isolating region, including the steps of:

forming a pad oxide film on a surface of a silicon substrate by thermal oxidation and forming a silicon nitride film which covers the pad oxide film and then conducting anisotropic etching sequentially on portions of the silicon nitride film and the pad oxide film which exist on a formation-reserved element isolating region to conduct anisotropic etching using the silicon nitride film as a mask in order to form a trench in a surface of the silicon substrate, thus forming a first silicon oxide film throughout on the surface by HD-PECVD accompanied by bias sputtering;

conducting CMP on the first silicon oxide film until a surface of the silicon nitride film is exposed;

forming by spin coating or LPD a second silicon oxide film which covers a surface of the silicon nitride film and a surface of the first silicon oxide film to thereby conduct heat treatment in an oxygen atmosphere, serving also to refine the second silicon oxide film;

conducting such anisotropic etching using an etching gas that an etching rate for the silicon oxide film may be equal to an etching rate for the silicon nitride film to thereby remove the second silicon oxide film in order to remove the silicon nitride film and the first silicon oxide film partially;

remove a residue of the silicon nitride film by wet etching; and removing by wet etching the residue of the second silicon oxide film, the pad oxide film and the first silicon oxide film until the surface of the silicon substrate is exposed.

In the foregoing second aspect, a preferable mode is one wherein the second silicon oxide film is formed by spin coating and consists of an organic SOG film or an inorganic SOG film made of silicon hydride sesqui-oxide.

According to a third aspect of the present invention, there is provided a method for forming an element isolating region, including the steps of:

forming a pad oxide film on a surface of silicon substrate by thermal oxidation and forming a silicon nitride film which covers the pad oxide film and then conducting anisotropic etching sequentially on portions of the silicon nitride film and the pad oxide film which exist on a formation-reserved element isolating region to conduct anisotropic etching using the silicon nitride film as a mask in order to form a trench in the surface of the silicon substrate, thus forming a first silicon oxide film throughout on the surface by HD-PECVD accompanied by bias sputtering;

conducting CMP on the first silicon oxide film until a surface of the silicon nitride film is exposed;

forming by spin coating or LPD a second silicon oxide film which covers a surface of the silicon nitride film and a surface of the silicon oxide film to thereby conduct heat treatment in an oxygen atmosphere, serving also to refine the second silicon oxide film;

conducting such anisotropic etching using an etching gas that an etching rate for the silicon oxide may be equal to an etching rate for silicon nitride film to thereby remove the second silicon oxide film in order to remove the silicon nitride film and the first silicon oxide film partially;

remove a residue of the silicon nitride film by wet etching; and removing by wet etching the pad oxide film and the first silicon oxide film until the surface of the silicon substrate is exposed.

In the foregoing third aspect, a preferable mode is one wherein the second silicon oxide film is formed by spin coating and consists of an organic SOG film or an inorganic SOG film made of silicon hydride sesqui-oxide as a material. According to a fourth aspect of the present invention, there is provided a method for forming an element isolating region, including the steps of:

forming a pad oxide film on a surface of a silicon substrate by thermal oxidation and forming a silicon nitride film which covers the pad oxide film and then conducting anisotropic etching sequentially on portions of the silicon nitride film and the pad oxide film which exist on a formation-reserved element isolating region to conduct anisotropic etching using the silicon nitride film as a mask in order to form a trench in the surface of the silicon substrate, thus forming a first silicon oxide film throughout on the surface by HD-PECVD accompanied by bias sputtering;

conducting CMP on the first silicon oxide film until a surface of the silicon nitride film is exposed;

forming by spin coating or LPD a second silicon oxide film which covers the silicon nitride film and the first silicon oxide film to thereby conduct heat treatment, serving also to refine the second silicon oxide film;

conducting such anisotropic etching using an etching gas that an etching rate for the silicon oxide film may be higher than an etching rate for the silicon nitride film to thereby remove the second silicon oxide film in order to remove the silicon nitride film partially at the same time as removing the first silicon oxide film until a surface of the first silicon oxide film is equal to a surface of the pad oxide film in level;

removing a residue of the silicon nitride film by wet etching; and removing by wet etching the second oxide film, the pad oxide film, and the first silicon oxide film until the surface of the silicon substrate is exposed.

In the foregoing fourth aspect, a preferable mode is one wherein the second silicon oxide film is formed by spin coating and consists of an organic SOG or an inorganic SOG film made of silicon hydride sesqui-oxide as a material. According to a fifth aspect of the present invention, there is provided a method for forming an element isolating region, including the steps of:

forming a pad oxide film on a surface of a silicon substrate by thermal oxidation and forming a silicon nitride film which covers the pad oxide film and then conducting anisotropic etching sequentially on portions of the silicon nitride film and the pad oxide film which exist on a formation-reserved element isolating region to conduct anisotropic etching using the silicon nitride film as a mask in order to form a trench in the surface of the silicon substrate, thus forming a first silicon oxide film which has a film thickness smaller than ½ of a minimum width of the trench by Low Pressure CVD (LPCVD) throughout on the surface;

forming by spin coating or LPD a second silicon oxide film which covers a surface of the first silicon oxide film to thereby conduct first heat treatment in an oxygen atmosphere, serving also to refine the second silicon oxide film;

conducting CMP on the second and first silicon oxide films until a surface of the silicon nitride film is exposed;

forming by spin coating or LPD a third silicon oxide film which covers the silicon nitride film and the first and second silicon oxide films to thereby conduct second heat treatment in an oxygen atmosphere, serving also to refine the third silicon oxide film;

conducting such anisotropic etching using an etching gas that an etching rate for the silicon oxide film may be equal to an etching rate for the silicon nitride film to remove the third silicon oxide film and also remove the silicon nitride film, the second silicon oxide film, and the first silicon oxide film until the silicon nitride film is removed completely; and removing by wet etching the pad oxide film, the second silicon oxide film, and the first silicon oxide film until at least the surface of the silicon substrate is exposed. According to a sixth aspect of the present invention, there is provided a method for forming an element isolating region, including the steps of:

forming a pad oxide film on a surface of a silicon substrate by thermal oxidation and forming a silicon nitride film which covers the pad oxide film and then conducting anisotropic etching sequentially on portions of the silicon nitride film and the pad oxide film which exist on a formation-reserved element isolating region to conduct anisotropic etching using the silicon nitride film as a mask in order to form a trench in the surface of the silicon substrate, thus forming a first silicon oxide film having a film thickness smaller than ½ of a minimum width of the trench throughout on the surface by LPCVD.

forming by spin coating or LPD a second silicon oxide which covers a surface of the first silicon oxide film to thereby conduct first heat treatment in an oxygen atmosphere, serving also to refine the second silicon oxide film;

conducting CMP on the second and first silicon oxide films until a surface of the silicon nitride film is exposed;

forming by spin coating or LPD a third silicon oxide film which covers the silicon nitride film and the first and second silicon oxide films to thereby conduct second heat treatment, serving also to refine the third silicon oxide film;

conducting such anisotropic etching using an etching gas that an etching rate for the silicon oxide film may be equal to an etching rate for the silicon nitride film to remove the third silicon oxide film and also remove the silicon nitride film, the second silicon oxide film, and the first silicon oxide film so as to leave a residue of the silicon nitride film partially;

removing the residue of the silicon nitride film by wet etching; and removing by wet etching the residue of the third silicon oxide film, the pad oxide film, the second silicon oxide film, and the first silicon oxide film until the surface of the silicon substrate is exposed.

According to a seventh aspect of the present invention, there is provided a method for forming an element isolating region, including the steps of:

forming a pad oxide film on a surface of a silicon substrate by thermal oxidation and forming a silicon nitride film which covers the pad oxide film and then conducting anisotropic etching sequentially on portions of the silicon nitride film and the pad oxide film which exist on a formation-reserved element isolating region to conduct anisotropic etching using the silicon nitride film in order to form a trench in the surface of the silicon substrate, thus forming a first silicon oxide film having a film thickness smaller than ½ of a minimum width of the trench throughout on the surface by LPCVD;

forming by spin coating or LPD a second silicon oxide film which covers a surface of the first silicon oxide film to thereby conduct first heat treatment in an oxygen atmosphere, serving also to refine the second silicon oxide film;

conducting CMP on the second and first silicon oxide films until a surface of the silicon nitride film is exposed;

forming by spin coating or LPD a third silicon oxide film which covers surfaces of the silicon nitride film and the first and second silicon oxide films to thereby conduct second heat treatment in an oxygen atmosphere, serving also to refine the third silicon oxide film;

conducting anisotropic etching using such an etching gas that an etching rate for the silicon oxide film may be higher than an etching rate for the silicon nitride film to remove the third silicon oxide film, thus removing the silicon nitride film, the second silicon oxide film, and the first silicon oxide film partially;

removing a residue of the silicon nitride film by wet etching; and removing by wet etching the pad oxide film, the second silicon oxide film, and the first silicon oxide film until the surface of the silicon substrate is exposed.

According to a eighth aspect of the present invention, there is provided a method for forming an element isolating region, including the steps of:

forming a pad oxide film on a surface of a silicon substrate by thermal oxidation and forming a silicon nitride film which covers the pad oxide film and then conducting anisotropic etching sequentially on portions of the silicon nitride film and the pad oxide film which exist on a formation-reserved element isolating region to conduct anisotropic etching using the silicon nitride film as a mask in order to form a trench in the surface of the silicon substrate, thus forming a first silicon oxide film having a film thickness smaller than ½ of a minimum width of the trench throughout on the surface by LPCVD;

forming by spin coating or LPD a second silicon oxide film which covers a surface of the first silicon oxide film to thereby conduct first heat treatment in an oxygen atmosphere, serving also to refine the second silicon oxide film;

conducting CMP on the second and first silicon oxide films until a surface of the silicon nitride film is exposed;

forming by spin coating or LPD a third silicon oxide film which covers surfaces of the silicon nitride film and the first and second silicon oxide films to thereby conduct second heat treatment, serving also to refine the third silicon oxide film;

conducting such anisotropic etching using an etching gas that an etching rate for the silicon oxide film may be higher than an etching rate for the silicon nitride film to remove the third silicon oxide film and remove the silicon nitride film partially and also remove the second and first silicon oxide films until a surface of the second silicon oxide film and an upper edge surface of the first silicon oxide film is equal to a surface of the pad oxide film in level;

removing a residue of the silicon nitride film by wet etching; and removing by wet etching the third oxide film, the pad oxide film, the second silicon oxide film, and the first silicon oxide film until the surface of the silicon substrate is exposed.

With the above configurations, the silicon nitride film is used as the mask to form the trenches, on the surface of which is formed the thermal-oxidized film to thereby fill the trenches completely in order to form buried silicon oxide film, which then undergoes CMP using the silicon nitride film as the stopper, after which the organic SOG film or the inorganic SOG film made of silicon hydride sesqui-oxide as the material undergoes spin coating or LPD to form covering silicon oxide film to thereby cover the surface of the above-mentioned buried silicon oxide film, thus effectively repairing the micro-scratch generated in the surface of the buried silicon oxide film during the CMP step.

Accordingly, when heat treatment is conducted in an oxidation atmosphere for refinement also, a debot can be prevented from occurring even if wet etching is conducted after anisotropic etching conducted on both of the silicon oxide film and the silicon nitride film.

As a result, the invention makes it possible to easily avoid occurrence of the debot even in presence of a micro-scratch and easily suppress the effective expansion of the element forming region. Also, in a semiconductor device containing MOS transistors, the invention makes it possible to easily suppress an increase in the reverse narrow channel effect, deterioration of electric characteristics, and induction of etch residues of gate electrodes in post-steps.

BRIEF DESCRIPTION OF THE DRAWINGS

The above and other objects, advantages and features of the present invention will be more apparent from the following description taken in conjunction with the accompanying drawings in which:

FIGS. 1A to 1F are schematic cross-sectional views for showing element-isolating region forming steps according to a first embodiment of the present invention;

DESCRIPTION OF THE PREFERRED EMBODIMENTS

Figure 2A:
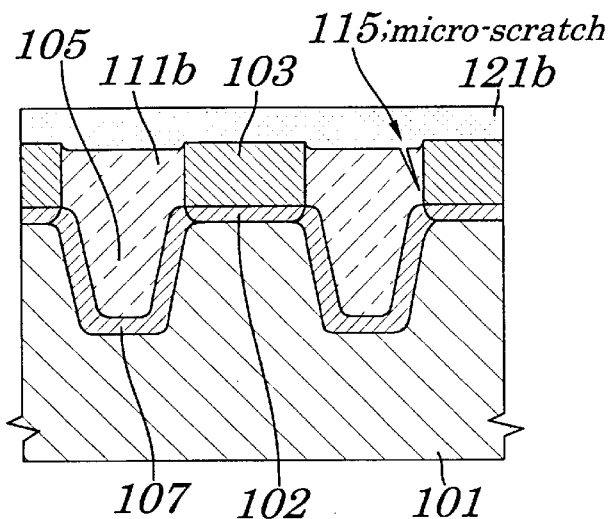
FIGS. 2A to 2E are schematic cross-sectional views for showing element-isolating region forming steps according to a second embodiment of the present invention.
Figure 2B:
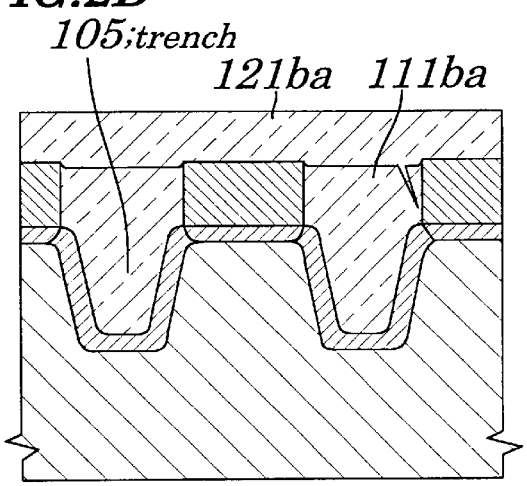
Figure 2C:
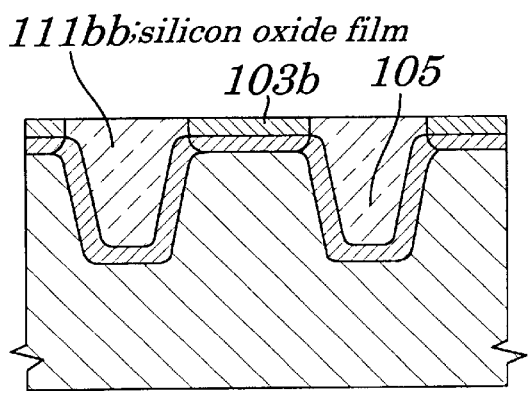

Best modes for carrying out the present invention will be described in further detail using various embodiments with reference to the accompanying drawings.

According to first, second, and third embodiments of the present invention, an STI trench (surface of which is covered by a thermal oxide film) is filled with a silicon oxide film formed by HD-PRCVD accompanied by bias sputtering. Also, according to the fourth embodiment of the present invention, the STI trench (surface of which is covered by a thermal oxide film) is filled with a first silicon oxide film formed by LPCVD and a second silicon oxide film formed by LPD or spin coating.

First Embodiment

FIGS. 1A to 1F are schematic cross-sectional views for showing element-isolating region forming steps according to a first embodiment of the present invention;

The following will describe a method for forming an STI according to the first embodiment with reference to FIGS. 1A to 1F.

First, a pad oxide film 102 with a film thickness of, for example, about 20 nm is formed on a surface of a silicon substrate 101 by thermal oxidation. Then, a silicon nitride film 103 with a film thickness of, for example, about 200 nm is formed on the pad oxide film 102 by CVD. The silicon nitride film 103 and the pad oxide film 102 are sequentially patterned anisotropically on a formation-reserved region of an element isolating region.

Next, trenches 105 are formed by anisotropic etching using the silicon nitride film 103 as a mask. Trenches 105 have their minimum width of, for example, about 0.25 $\mu$m, a minimum inter-spacing of, for example, about 0.25 $\mu$m, and a depth of about 0.3–0.4 $\mu$m. This anisotropic etching employs HBr (+$O_2$) or $Cl_2$ (+$O_2$) as its etching gas.

Next, on a surface of trenches 105 is formed a thermal-oxidized film 107 with a film thickness of up to about 20 nm by thermal oxidation at a temperature of 900–950° C. When the thermal-oxidized film 107 is thus formed, an upper edge of the trenches 105 is rounded off. Subsequently, a first silicon oxide film 111 with a film thickness of, for example, about 600 nm is formed by HD-PECVD (e.g., ECR) accompanied by bias sputtering. This first silicon oxide film 111 completely fills the trenches 105 (see FIG. 1A).

Next, CMP is conducted on the first silicon oxide film 111 using the silicon nitride film 103 as a stopper, to leave a silicon oxide film 111a. In this embodiment also, when CMP is conducted, a micro-scratch 115 is generated in a surface of the silicon oxide film 111a (see FIG. 1B).

Note here that in this embodiment, it is not preferable to employ a silicon oxide film by use of LPCVD in place of the first silicon oxide film 111 thus formed. This is because if the silicon oxide film by use of LPCVD has a large film thickness, it has a key-hole shaped void (key-hole void) formed at its trench, which cannot be eliminated by CMP, thus contributing to a variety of troubles. If this silicon oxide film by use of LPCVD has a small film thickness, on the other hand, a portion which fills the trenches 105 have a recess in this silicon oxide film. By the above-mentioned CMP processing, however, slurry residues in this recess cannot easily be removed, which is not preferably from a viewpoint of reliability.

Next, a second silicon oxide film 121a consisting of an organic SOG (Spin-On-Glass) film is formed by spin coating to thereby cover the surface of the silicon oxide film 111a including the silicon nitride film 103. The second silicon oxide film 121a has a film thickness of, for example, about 280 nm and preferably about 0.1–0.4 $\mu$m. Since a starting material for forming the silicon oxide film 121a is in a liquid state, in contrast to a case of using CVD or PVD such as sputtering, the micro-scratch 115 formed in the surface of the silicon oxide film 111a has also part of this second silicon oxide film 121a formed therein (see FIG. 1C). This second silicon oxide film 121a comes in, for example, an organic SOG film made of a material containing, for example, a Si—R (R: alkyl group).

Subsequently, heat treatment is conducted in a dry-$O_2$ atmosphere at a temperature of 900–950° C. to transform the second silicon oxide film 121a and silicon oxide film 111a into a silicon oxide film 121aa and silicon oxide film 121aaa respectively. This heat treatment makes the second silicon oxide film 121a finer and sufficiently dehydrates it and liberates R groups therefrom (see FIG. 1D). It is not preferable to conduct this heat treatment in a steam atmosphere in this embodiment because the surface of the trenches 105 are also oxidized. Prior to this heat treatment, cure processing may be conducted in a nitrogen atmosphere at a temperature of 500–600° C. in order to remove the R groups from the silicon oxide film 111a.

Note here that it is not preferable to employ a typical silica-based inorganic SOG film made of a material containing a Si—OH (silanol) bond, because it encounters drastic volumetric shrinkage during the above-mentioned heat treatment, thus being liable to generate a lot of cracks.

Next, an etching gas is used which is made up of trifluoro-methane ($CHF_3$) with a flow rate of $3.3 \times 10^{-2}$ L/min, tetrafluoro-methane ($CF_4$) with a flow rate of $2.7 \times 10^{-2}$ L/min, argon (Ar) with a flow rate of $5 \times 10^{-3}$ L/min, and oxygen ($O_2$) with a flow rate of $1 \times 10^{-3}$ L/min, to conduct anisotropic etching by use of a leaf-type RIE (Reactive Ion Etching) apparatus under conditions of a pressure of 10 Pa and a high-frequency source power of 1000 W (at a frequency of 13.56 MHz). In this anisotropic etching, an etching rate for the silicon oxide film is roughly equal to that for the silicon nitride film 103. This anisotropic etching is continued until the silicon nitride film 103 is removed to thus remove the silicon oxide film 121aa, leaving the silicon oxide film 111aa as a silicon oxide film 111ab. At this point in time, an upper surface of the silicon oxide film 111ab roughly agrees with a surface of the pad oxide film 102 in level. In this embodiment, this anisotropic etching is stopped from removing also the pad oxide film 102 in order not to damage by RIE a surface of portions of the silicon substrate 101 which are reserved as an element forming region (see FIG. 1E).

In this anisotropic etching, an emission spectrum (with a wavelength of 483 nm) of carbon monoxide (CO) generated during the etching of the silicon oxide film is used by a monitor. Also, when an emission amount of the emission spectrum of CO starts to decrease, etching is terminated of the silicon oxide film 121aa and, when it starts to increase again, etching is terminated of the silicon nitride film 103, thus stopping this anisotropic etching.

Subsequently, the pad oxide film 102 is removed using a buffered hydrofluoric acid (or diluted hydrofluoric acid) until the surface of the silicon substrate 101 is exposed. At the same time, the thermal-oxidized film 107 and the silicon oxide film 111ab are also removed partially, to thereby provide a thermal-oxidized film 107a and a silicon oxide film lilac respectively. At this point in time, an upper edge of the thermal-oxidized film 107 roughly agrees with an upper surface of the silicon oxide film 107a in level. With this, the trenches 105 are filled by the silicon oxide film 111ac with the thermal-oxidized film 107 therebetween, thus completing the STI according to this embodiment (see FIG. 1F).

With the first embodiment, even if the micro-scratch 115 has already been formed on the surface of the silicon oxide film 111a immediately after CMP, the second silicon oxide film 121a is formed to completely fill a void of the micro-scratch 115, so that the micro-scratch 115 can be considered to have disappeared effectively. When the silicon oxide film 111a undergoes anisotropic etching or wet etching to provide the silicon oxide film 111ab or the silicon oxide film 111ac, the micro-scratch 115 does not expand anisotropically. Accordingly, even if the above-mentioned micro-void is present near a lower edge of the end of the silicon nitride film 103, occurrence of a debot is suppressed.

As a result, the element isolating region can be easily regulated from expanding effectively. Also, in a semiconductor device having MOS transistors therein, it is possible to easily suppress increases in reverse narrow channel effect, deterioration in electric characteristics, and induction of etch residue of gate electrodes in post-steps.

Second Embodiment

FIGS. 2A to 2E are schematic cross-sectional views for showing element-isolating region forming steps according to a second embodiment of the present invention;

The following will describe a method for forming an STI according to the second embodiment with reference to FIGS. 2A to 2E.

First, like in the case of the above-mentioned first embodiment, a pad oxide film 102 is formed by thermal oxidation on a surface of a silicon substrate 101 and then a silicon nitride film 103 is formed by CVD on a surface of the pad oxide film 102. Portions of the silicon nitride film 103 and the pad oxide film 102 which exist on a formation-reserved element isolating region are sequentially patterned by anisotropic etching. Trenches 105 are formed by anisotropic etching using the silicon nitride film 103 as a mask. On a surface of the trenches 105 is formed a thermal-oxidized film 107. The first silicon oxide film (not shown) having a film thickness of, for example, about 600 nm is formed by HD-PECVD accompanied by bias sputtering. Subsequently, CMP is conducted on the above-mentioned first silicon oxide film using the silicon nitride film 103 as a stopper to thereby leave the first silicon oxide film 111b. By this CMP processing, a micro-scratch 115 is generated in the surface of the first silicon oxide film 111b.

Next, a second silicon oxide film 121b made of an organic SOG film containing silicon hydride sesqui-oxide ($HSiO_{3/2}$)n (where n is an arbitrary natural number) as a material is formed by spin coating to thereby cover the first surface of the silicon oxide film 111b including the silicon nitride film 103. The second silicon oxide film 121b has preferably a film thickness of about 0.1–0.4 μm. Since a starting material for forming the second silicon oxide film 121b is in a liquid state, the micro-scratch 115 formed in the surface of the first silicon oxide film 111b also has part of the second silicon oxide film 121b formed therein (see FIG. 2A).

Subsequently, heat treatment is conducted in a dry-$O_2$ atmosphere at a temperature of 900–950° C. to thereby transform the second silicon oxide film 121b and the first silicon oxide film 111b into a silicon oxide film 121ba and silicon oxide film 111ba respectively. This heat treatment makes the second silicon oxide film 121b finer and sufficiently dehydrates it and liberates R groups therefrom (see FIG. 2B). Prior to this heat treatment, cure processing may be conducted in a nitride atmosphere at a temperature of 500–600° C. in order to remove water contents from a silicon oxide film 121b beforehand.

In contrast to typical inorganic SOG films made of a material containing silanol bonds, the above-mentioned second silicon oxide film 121b encounters little volumetric shrinkage, actually less than the silicon oxide film 121a (FIG. 1C) in the above-mentioned first embodiment, and also little crack generation.

Next, such anisotropic etching is conducted that an etching rate for the silicon oxide film and that for the silicon nitride film 103 used in the above-mentioned first embodiment may be roughly equal to each other. This anisotropic etching is actually conducted not to remove the silicon nitride film 103 completely, thus leaving a silicon nitride film 103b and a silicon oxide film 111bb respectively. An upper surface of the silicon nitride film 103b and that of the silicon oxide film 111bb roughly agree with each other, with the silicon nitride film 103b having a film thickness of, for example, about 10 nm (see FIG. 2C).

Figure 2D:
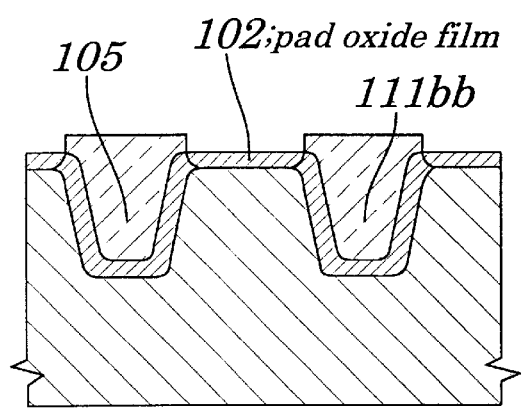
Figure 2E:
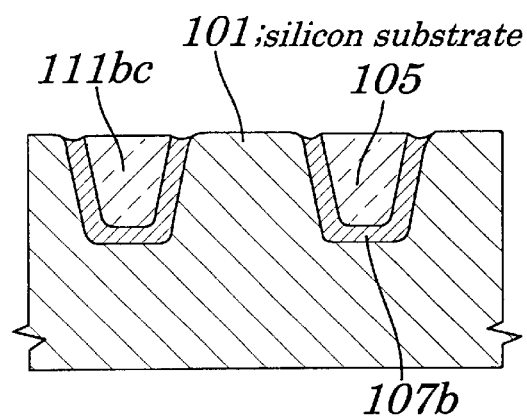

Next, wet etching by use of hot phosphoric acid is conducted on the silicon nitride film 103b to remove it locally, thus exposing a surface of the pad oxide film 102 (see FIG. 2D).

Subsequently, the pad oxide film 102 is removed by buffered hydrofluoric acid (or diluted hydrofluoric acid) until a surface of the silicon substrate 101 is exposed. At a same time, the thermal-oxidized film 107 and the silicon oxide film 111bb are also removed partially to thereby provide a thermal-oxidized film 107b and a silicon oxide film 111bc respectively. By this etching, it is not difficult to keep a level difference between an upper surface of the silicon oxide film 111bc and a surface of the silicon substrate 101 within ±5 nm. In fact, at this point in time an upper edge of the thermal-oxidized film 107b has become lower than the upper surface of the silicon oxide film 111bc by about 10 nm in level. With this, the trenches 105 are filled by the silicon oxide film 111bc with the thermal-oxidized film 107b therebetween to thus complete the STI according to the second embodiment of the present invention (see FIG. 2E).

With the second embodiment, in anisotropic etching for etching the silicon nitride film and silicon oxide films roughly at a same etching rate, the silicon nitride film 103 is not completely removed to thereby leave its residues, thus avoiding the pad oxide film 102 from being subjected to this anisotropic etching.

Accordingly, controllability of a series of etching steps up to removing of the pad oxide film 102 is more superior in the second embodiment than in the above-mentioned first embodiment.

Also, in the second embodiment, the second silicon oxide film 121b is not limited to an inorganic SOG film made of such a material as silicon hydride sesqui-oxide but may be an organic SOG film like in the case of the above-mentioned first embodiment. Similarly, the second silicon oxide film 121b employed in the above-mentioned first embodiment maybe an inorganic SOG film made of such a material as silicon hydride sesqui-oxide.

Third Embodiment

FIGS. 3A to 3E are schematic cross-sectional views for showing element-isolating region forming steps according to a third embodiment of the present invention;

The following will describe a method for forming an STI according to the third embodiment with reference to FIGS. 3A to 3E.

First, like in cases of the above-mentioned first embodiment and second embodiment, a pad oxide film 102 is formed on a surface of a silicon substrate 101 by thermal oxidation and then a silicon nitride film 103 is formed by CVD on a surface of the pad oxide film 102. Portions of the silicon nitride film 103 and the pad oxide film 102 which exit on a formation-reserved element isolating region are patterns by anisotropic etching respectively. Anisotropic etching by use of the silicon nitride film 103 as a mask is conducted to form trenches 105. On a surface of trenches 105 is formed a thermal-oxidized film 107. A first silicon oxide film (not shown) having a film thickness of, for example, about 600 nm is formed by HD-PECVD accompanied by bias sputtering. Subsequently, CMP is conducted on the above-mentioned first silicon oxide film using the silicon nitride film 103 as a stopper to thereby leave a first silicon oxide film 111c. By this CMP processing, the micro-scratch 115 is generated in a surface of the first silicon oxide film 111c.

Next, liquid-phase deposition (LPD) is conducted to form a second silicon oxide film 121c to thereby cover a surface of the first silicon oxide film 111c and the silicon nitride film 103. An solution used in this LPD processing is prepared, as disclosed in Japanese Patent Application Laid-open No. Hei 6-61343, for example by adding 10–50 ml/h of a 0.6 wt % solution of ortho-acetic acid ($H_3BO_3$) to 1L of a 40 wt % solution of hexa-fluoro silicic acid ($H_2SiF_6$). The second silicon oxide film 121c has preferably a thickness of about 0.1–0.4 μm. Since the second silicon oxide film 121c is formed in a liquid, the micro-scratch 115 formed in the surface of the silicon oxide film 111c has also part of this second silicon oxide film 121c formed therein (see FIG. 3A).

Subsequently, heat treatment is conducted in a dry-$O_2$ atmosphere at a temperature of 900–950° C. to thereby transform the second silicon oxide film 121c and the silicon oxide film 111c into a silicon oxide film 121ca and a first silicon oxide film 111ca respectively. This heat treatment makes the second silicon oxide film 121c finer and sufficiently dehydrates it and liberates R groups therefrom (see FIG. 3B). Prior to this heat treatment, cure processing may be conducted in a nitrogen atmosphere at a temperature of 500–600° C. to remove water contents from the second silicon oxide film 121c beforehand.

Next, the silicon oxide film and the silicon nitride film are subjected to such anisotropic etching by use of an etching gas that gives a higher etching rate for the former than that for the silicon nitride film 103, to remove the silicon oxide film 121ca completely, thus removing also the silicon nitride film 103 and the first silicon oxide film 111ca partially. For example, supposing an etching rate ratio is about 2.0, an etching gas consisting of octa-fluoro-cylcobutane ($C_4F_4$) with a flow rate of $1.8\times10^{-2}$ L/min and argon with a flow rate of 0.4 L/min is used for a high-density plasma-etching apparatus (e.g., ECR etching apparatus) under conditions of a pressure of 2.7 Pa, a high-frequency source power of 2000 W (27 MHz) for an upper electrode, and a high-frequency source power of 1200 W (800 KHz) for a lower electrode to thereby conduct the above-mentioned anisotropic etching. This etching is actually conducted to leave a silicon nitride film 103c with a film thickness of, for example, about 105 nm and a silicon oxide film 111cb with its high surface higher by, for example, about 10 nm higher than a surface of the pad oxide film 102 in level (see FIG. 3C).

Note here that in the third embodiment, by the above-mentioned anisotropic etching, the silicon nitride film 103 may be etched until an upper surface of the first silicon oxide film 111ca roughly agrees with the surface of the pad oxide film 102 in level, to leave the silicon nitride film 103 to a film thickness of about 100 nm.

Figure 3A:
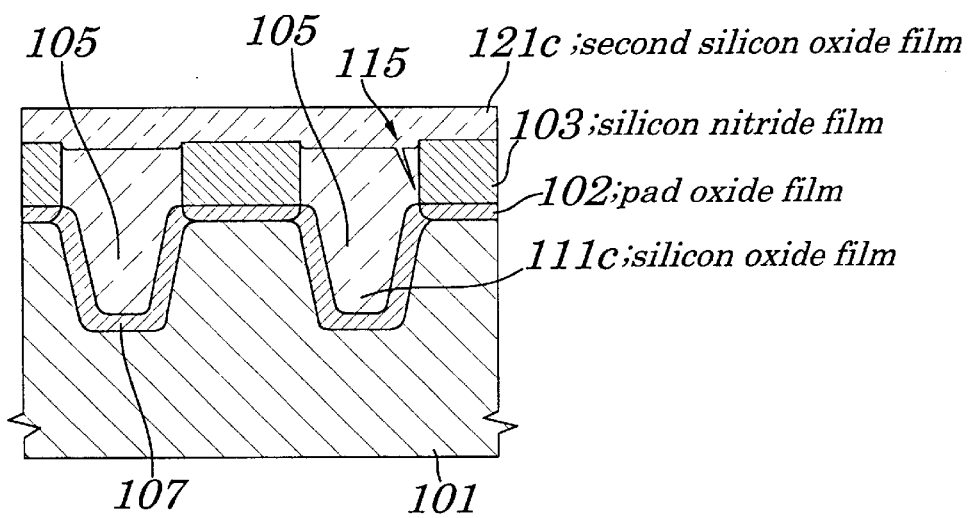
FIGS. 3A to 3E are schematic cross-sectional views for showing element-isolating region forming steps according to a third embodiment of the present invention.
Figure 3B:
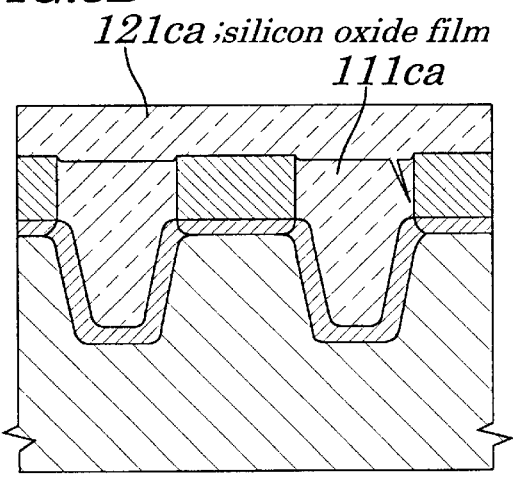
Figure 3D:
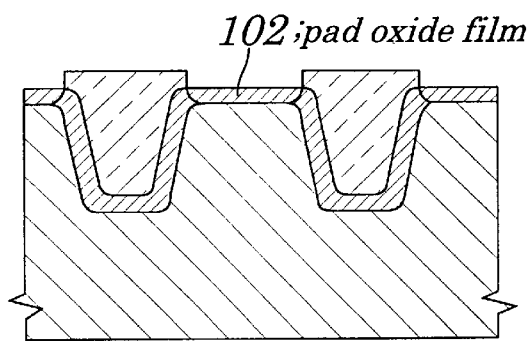
Figure 3C:
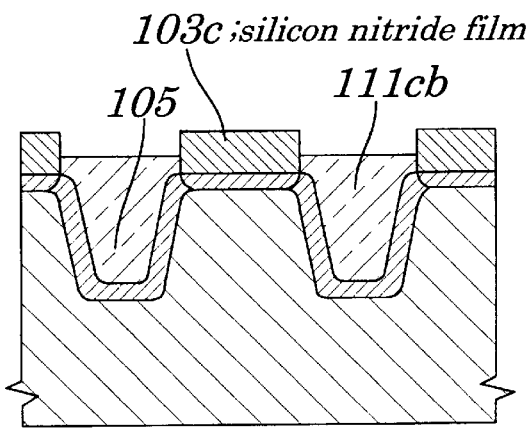
Figure 3E:
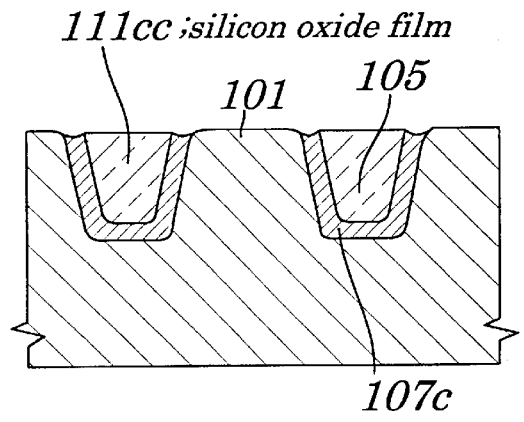
Figure 4A:
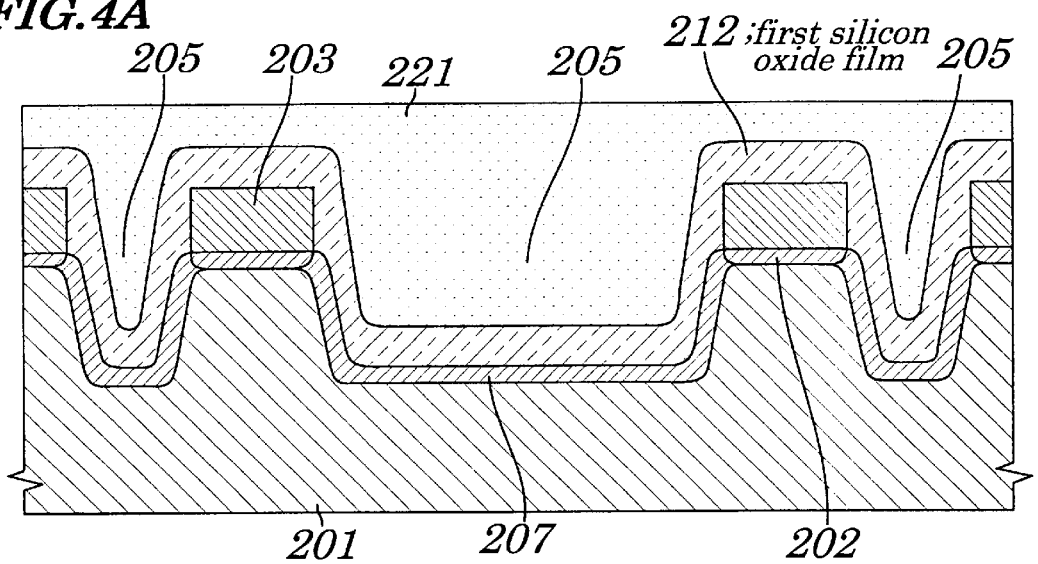
FIGS. 4A, 4B and 4C are schematic cross-sectional views for showing element-isolating region forming steps according to a fourth embodiment of the present invention.
Figure 4B:
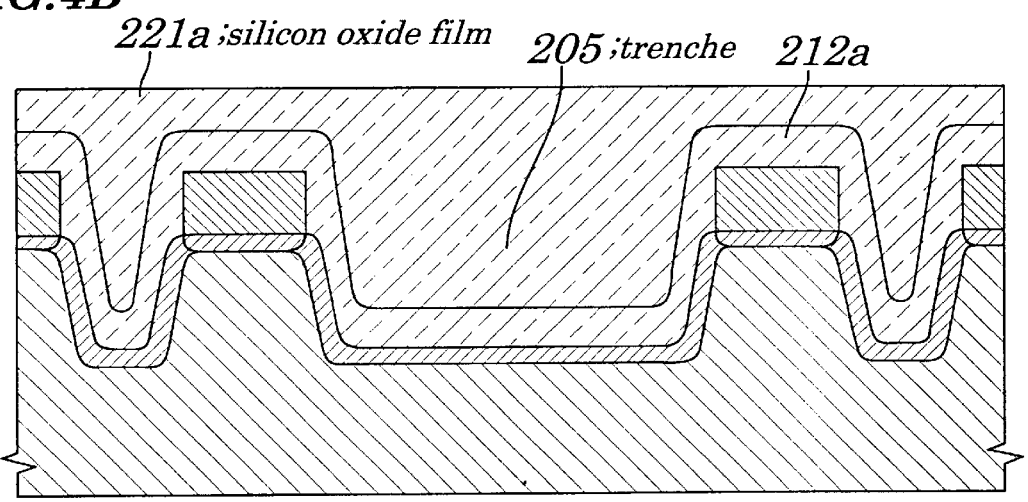
Figure 4C:
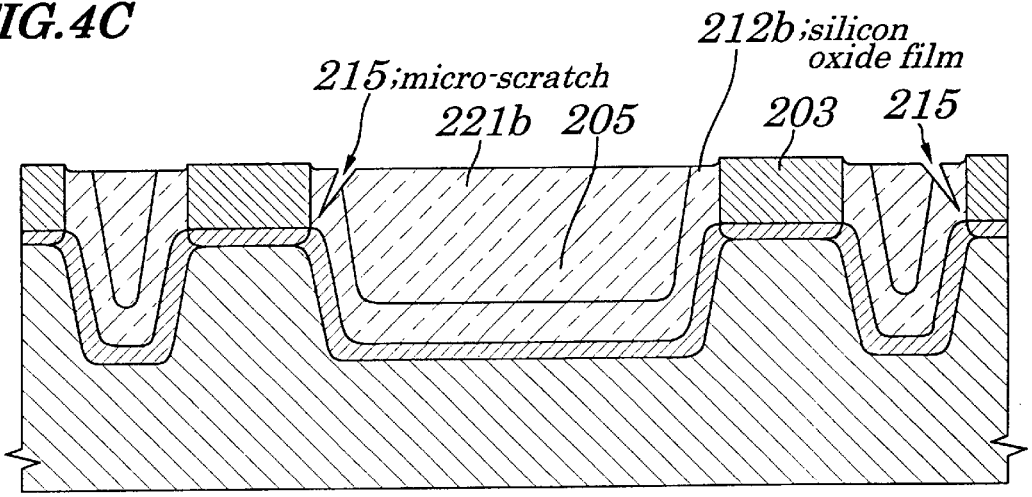

Next, wet etching by use of hot phosphoric acid is conducted on the silicon nitride film 103c to remove it locally until the surface of the pad oxide film 102 is exposed (see FIG. 3D).

Subsequently, the pad oxide film 102 is removed by buffered hydrofluoric acid (or diluted hydrofluoric acid) until a surface of the silicon substrate 101 is exposed. At the same time, the thermal-oxidized film 107 and the silicon oxide film 111cb are also removed partially to provide a thermal-oxidized film 107c and a silicon oxide film 111cc respectively. By this etching also, it is not difficult to hold a level difference between an upper surface of the silicon oxide film 111cc and the surface of the silicon substrate 101 within ±5 nm. An upper edge of the thermal-oxidized film 107c is roughly lower than the upper surface of the silicon oxide film 111cc by about 10 nm in level. Accordingly, the trenches 105are filled by the silicon oxide film 111cc with the thermal-oxidized film 107c therebetween, to complete the STI according to the third embodiment (see FIG. 3E).

The third embodiment has same effects as described in the above-mentioned second embodiment.

Also, in the above-mentioned third embodiment, the second silicon oxide film 121c is not limited to one by LPD but may be an organic SOG film, an inorganic SOG film made of such a material as silicon hydride sesqui-oxide like in the case of the above-mentioned first embodiment and second embodiment. Likewise, the second silicon oxide film 121c in the above-mentioned first embodiment and second embodiment may be formed by LPD.

Fourth Embodiment

FIGS. 4A to 6B are schematic cross-sectional views for showing element-isolating region forming steps according to a fourth embodiment of the present invention;

The following will describe a method for forming an STI according to the fourth embodiment with reference to FIGS. 4A to 6B.

First, a pad oxide film 202 with a film thickness of, for example, about 20 nm is formed on a silicon substrate 201 by thermal oxidation. A silicon nitride film 203 with a film thickness of, for example, about 200 nm is formed by CVD on a surface of the pad oxide film 202. Portions of the silicon nitride film 203 and the pad oxide film 202 which exist on a formation-reserved element isolating region are sequentially patterned by anisotropic etching.

Next, anisotropic etching is conducted using the silicon nitride film 203 to thereby form trenches 205. The trenches 205 have a minimum width of, for example, about 0.25 μm, a minimum inter-spacing of, for example, about 0.25 μm, and a depth of about 0.3–0.4 μm. An etching gas used in this anisotropic etching is HBr ($+O_2$) or $Cl_2$ ($+O_2$) Next, on a surface of the trenches 205 is formed a thermal-oxidized film 207 with a film thickness of about up to 20 nm by thermal oxidation at a temperature of 900–950° C. The thermal-oxidized film 207 is thus formed to round off an upper edge of the trenches 205. Subsequently, a first silicon oxide film 212 having a film thickness of, for example, about 100 nm is formed by LPCVD. At this point in time, in the trenches 205, a recess (not key hole void) has been formed in the first silicon oxide film 212. To fill the trenches 205 only with the first silicon oxide film 212 formed by CVD, the first silicon oxide film 212 must have a film thickness not larger than ½ (e.g., 125 nm) of a minimum width of the trenches 205 because the trenches 205 have a key hole void formed therein due to the first silicon oxide film 212.

Next, a second silicon oxide film 221 is formed by spin-coating an inorganic SOG film made of, for example, a silicon hydride sesqui-oxide as a material. To completely fill the recess in the first silicon oxide film 212 formed in the trenches 205, the second silicon oxide film 221 must have a film thickness of about 550–700 nm (see FIG. 4A). Note here that in this embodiment, the second silicon oxide film 221 is not limited to the above-mentioned inorganic SOG film but may be an organic SOG film or even a silicon oxide film formed by LPD.

Subsequently, first heat treatment is conducted in a dry-$O_2$ atmosphere at a temperature of 900–950° C. to thereby transform the second silicon oxide film 221 and first silicon oxide film 212 into silicon oxide film 221a and silicon oxide film 212a respectively. This heat treatment makes the second silicon oxide film 221 finer and sufficiently dehydrates it (see FIG. 4B). Prior to this heat treatment, to remove water contents from the second silicon oxide film 221, cure processing may be conducted in a nitrogen atmosphere at a temperature of 500–600° C.

Next, CPM is conducted on the silicon oxide film 221a silicon oxide film and 212a using the silicon nitride film 203 as a stopper to thereby leave a silicon oxide film 221b and a silicon oxide film 212b respectively. In this embodiment also, when CMP is thus conducted, a micro-scratch 215 is generated in a surface of the silicon oxide film 221b (or the silicon oxide film 212b) (see FIG. 4C).

Next, an inorganic SOG film made of, for example, silicon hydride sesqui-oxide as a material is spin-coated to thereby form a third silicon oxide film 222. The third silicon oxide film 222 has preferably have a film thickness of about 0.1–0.4 μm. The surface of the silicon oxide film 221b and an upper edge surface of the silicon oxide film 212b are covered by the third silicon oxide film 222. Like in a case of the above-mentioned first embodiment, a starting material of silicon oxide is also in a liquid state, so that a void due to the micro-scratch 215 is also filled with part of the third silicon oxide film 222 (see FIG. 5A). Note here that as the above-mentioned second silicon oxide film 221 in this embodiment, the third silicon oxide film 222 in this embodiment is not limited to the above-mentioned SOG film but may be an organic SOG film or even a silicon oxide film formed by LPD.

Subsequently, second heat treatment is conducted in a dry-$O_2$ atmosphere at a temperature of 900–950° C. to thereby transform the third silicon oxide film 222 into a silicon oxide film 222a. This heat treatment makes the third silicon oxide film 222 finer and sufficiently dehydrates it (see FIG. 5B). Prior to this second heat treatment, in order to remove water contents from the third silicon oxide film 222, cure processing may be conducted in a nitrogen atmosphere at a temperature of 500–600° C.

Figure 5A:
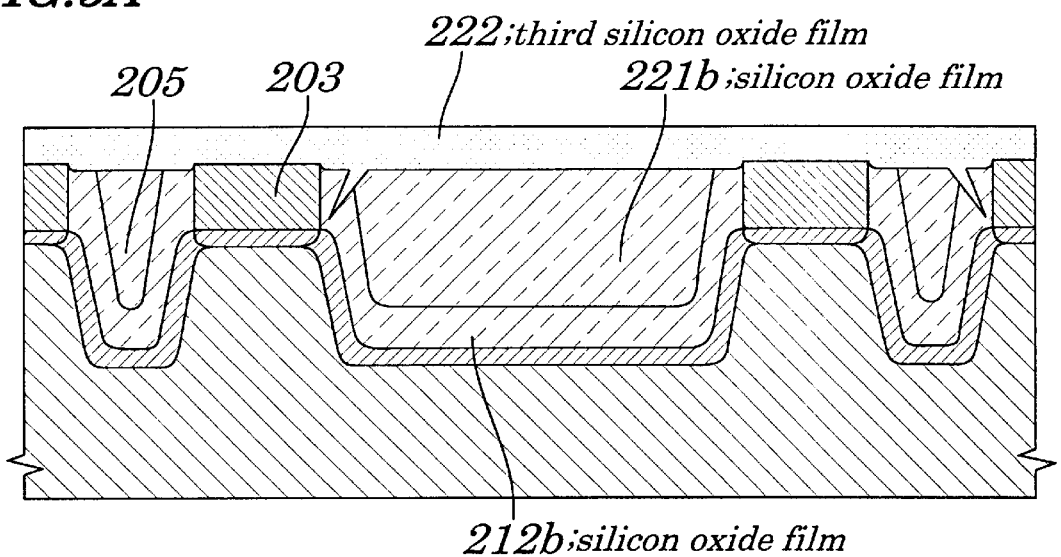
FIGS. 5A, 5B and 5C are schematic cross-sectional views for showing further element-isolating region forming steps according to the fourth embodiment of the present invention.
Figure 5B:
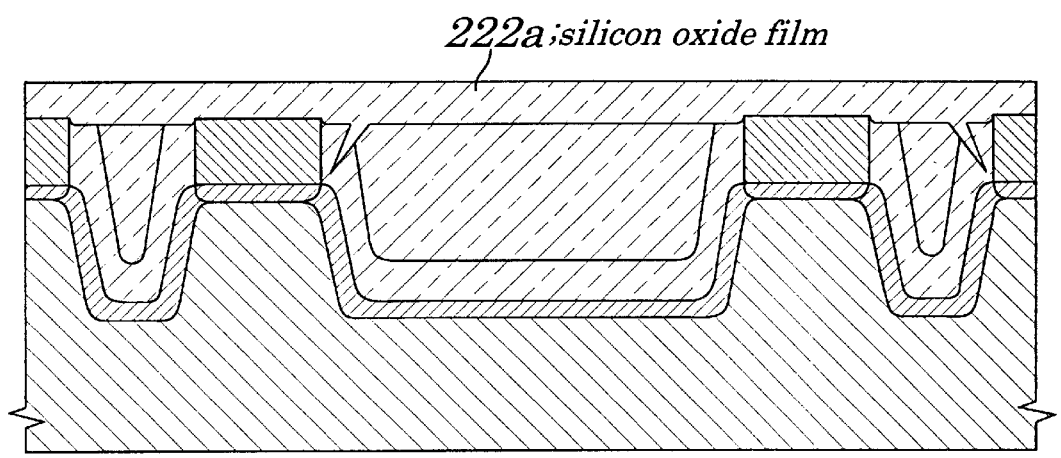
Figure 5C:
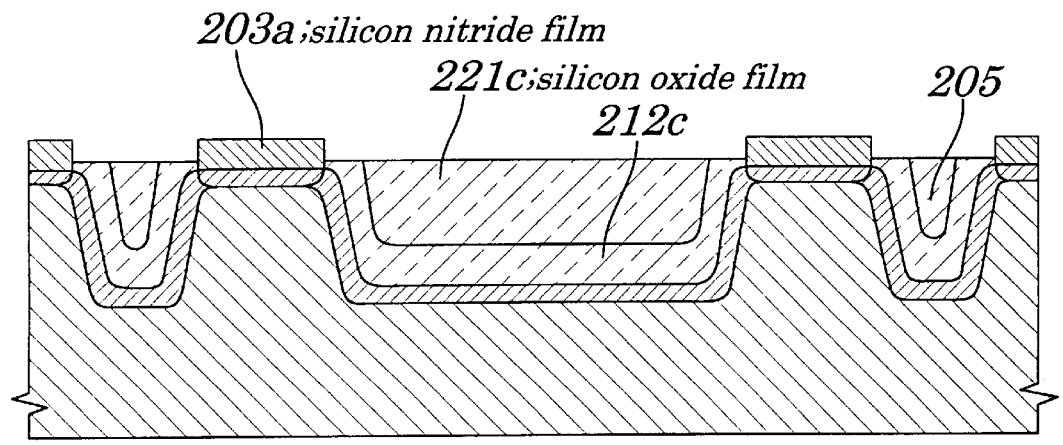

Next, anisotropic etching similar to, for example, that in the third embodiment is conducted to completely remove the silicon oxide film 222a, thus leaving a silicon nitride film 203a with a film thickness of, for example, about 105 nm and a silicon oxide film 221c and a silicon oxide film 212c having their respective upper surface and upper edge surface higher than the surface by, for example, about 10 nm (see FIG. 5C).

Note here that in this embodiment also, the abovementioned anisotropic etching may be conducted to etch the silicon nitride film 203 until the upper surface of the second silicon oxide film 221 (and the upper edge surface of the first silicon oxide film 212) may roughly agree with the surface of the pad oxide film 202 in level. Further, this anisotropic etching may be conducted like in a case of the abovementioned first embodiment or second embodiment.

Figure 6A:
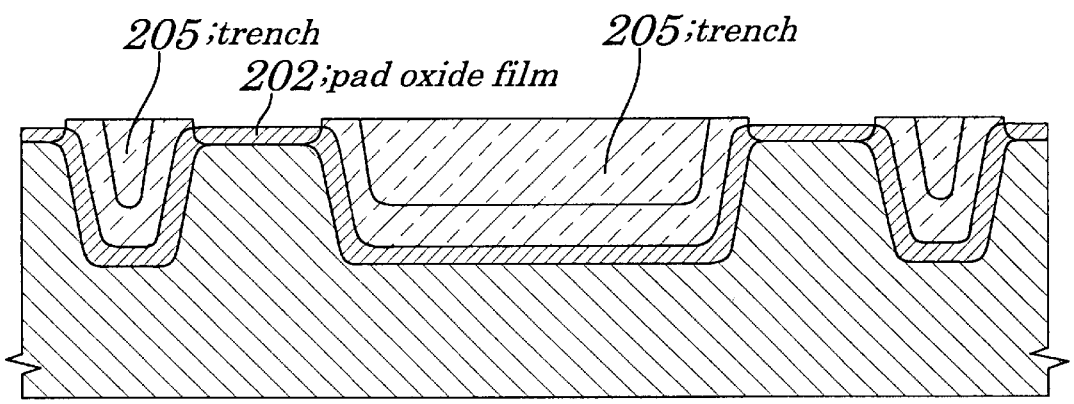
FIGS. 6A and 6B are schematic cross-sectional views for showing still further element-isolating region forming steps according to the fourth embodiment of the present invention.
Figure 6B:
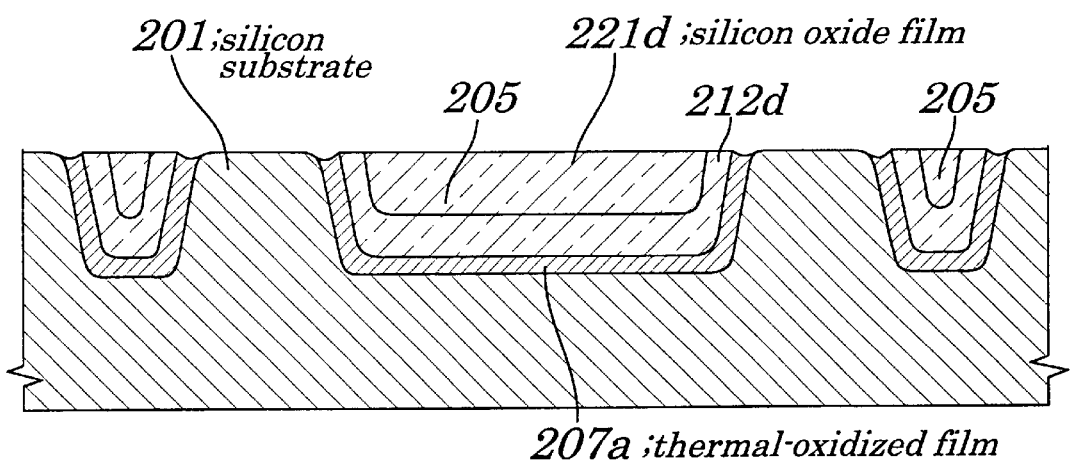
Figure 7A:
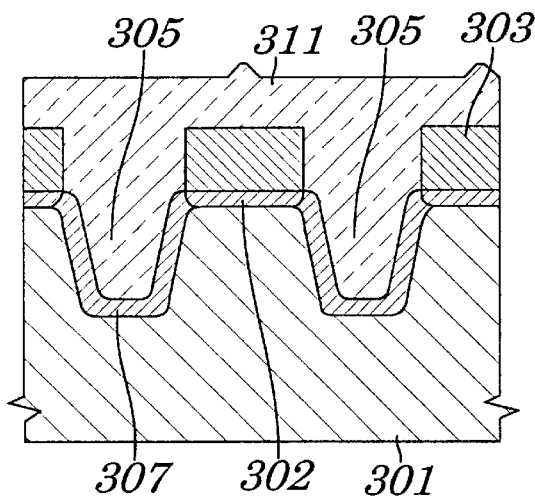
FIGS. 7A to 7E are schematic cross-sectional views for showing conventional STI forming steps, illustrating its problems.
Figure 7B:
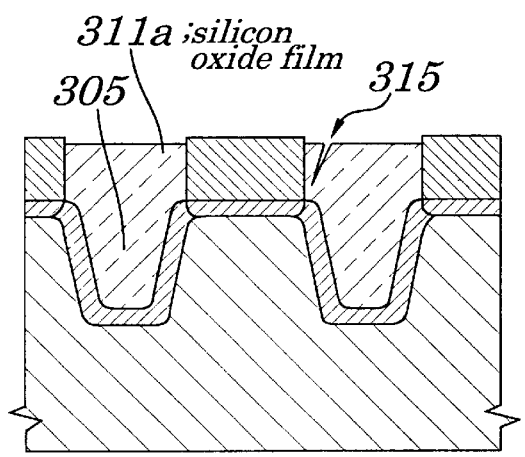
Figure 7C:
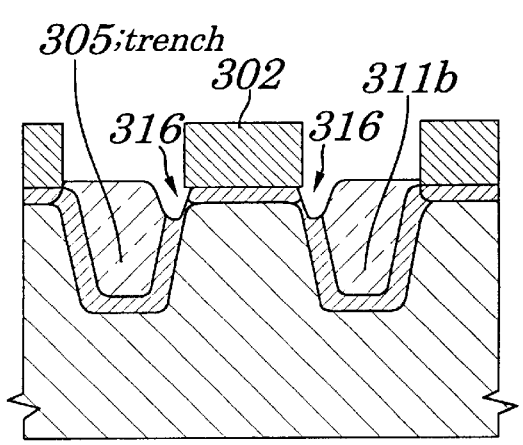
Figure 7D:
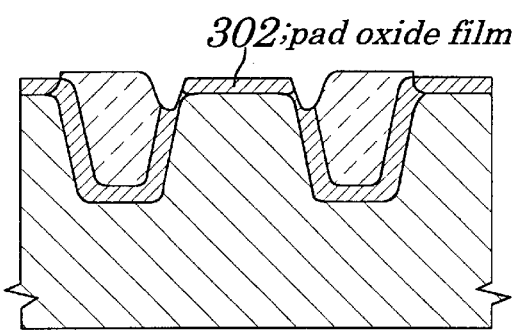
Figure 7E:
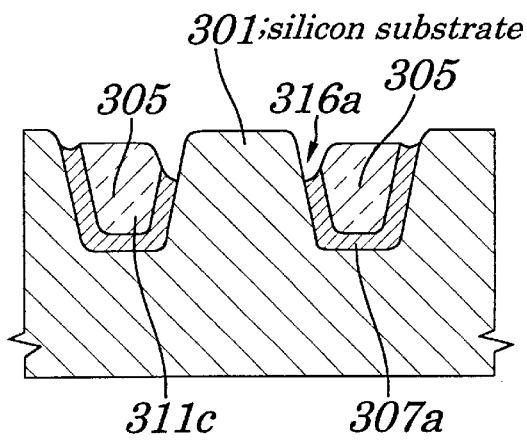

Next, the silicon nitride film 203a is subjected to wet etching using hot phosphoric acid and locally removed to thereby expose a surface of the pad oxide film 202 (see FIG. 6A).

Subsequently, buffered hydrofluoric acid (or diluted hydrofluoric acid) is used to remove the pad oxide film 202 until a surface of the silicon substrate 201 is exposed. At a same time, the thermal-oxidized film 207, the silicon oxide film 212c, and the silicon oxide film 221c are also removed partially to provide a thermal-oxidized film 207a, a silicon oxide film 212d, and a silicon oxide film 221d respectively. By this etching also, it is not difficult to hold a level difference between an upper end surface of the silicon oxide film 212d and an upper surface of the silicon oxide film 221d and a surface of the silicon substrate 201 within ±5 nm. An upper edge of the thermal-oxidized film 207a is lower than the upper surface of the silicon oxide film 221d (and the upper edge surface of the silicon oxide film 212d) by about 10 nm. With this, the trenches 205 are filled by the silicon oxide film 212d and the silicon oxide film 221d with the thermal-oxidized film 207a to thereby complete the STI according to this embodiment (see FIG. 6B).

The fourth embodiment has same effects as described in the above-mentioned third embodiment. Also, the abovementioned anisotropic etching thus selectively conducted on the silicon oxide film and the silicon nitride film permits the fourth embodiment to have effects equivalent to those of the above-mentioned first or second embodiment.

It is apparent that the present invention is not limited to the above embodiments but may be changed and modified without departing from the scope and spirit of the invention.

What is claimed is:

1. A method for forming an element isolating region, comprising steps of:

forming a pad oxide film on a surface of a silicon substrate by thermal oxidation and forming a silicon nitride film which covers said pad oxide film and then conducting anisotropic etching sequentially on portions of said silicon nitride film and said pad oxide film which exist on a formation-reserved element isolating region to then conduct anisotropic etching using said silicon nitride film as a mask in order to form trenches in said surface of said silicon substrate, thus forming a first silicon oxide film throughout on said surface of said silicon substrate by high-density plasma-enhanced chemical vapor deposition;

conducting chemical mechanical polishing on said first silicon oxide film until a surface of said silicon nitride film is exposed;

forming by spin coating or liquid-phase deposition a second silicon oxide film which covers said surface of said silicon nitride film and a surface of said first silicon oxide film to thereby conduct heat treatment in an oxygen atmosphere, serving also to refine said second silicon oxide film;

conducting such anisotropic etching using an etching gas that an etching rate for said first silicon oxide film and said second silicon oxide film may be equal to an etching rate for said silicon nitride film to thereby remove said second silicon oxide film in order to remove said silicon nitride film and said first silicon oxide film; and removing by wet etching said pad oxide film and said first silicon oxide film until at least said surface of said silicon substrate is exposed.

2. The method for forming said element isolating region according to claim 1, wherein said second silicon oxide film is an inorganic spin-on-glass film or an organic spin-on-glass film made of silicon hydride sesqui-oxide, which is formed by said spin coating.

3. The method for forming said element isolating region according to claim 1, wherein said high-density plasma-enhanced chemical vapor deposition is accompanied by bias sputtering.

4. A method for forming an element isolating region, comprising steps of:

forming a pad oxide film on a surface of a silicon substrate by thermal oxidation and forming a silicon nitride film which covers said pad oxide film and then conducting anisotropic etching sequentially on portions of said silicon nitride film and said pad oxide film which exist on a formation-reserved element isolating region to conduct anisotropic etching using said silicon nitride film as a mask in order to form trenches in said surface of said silicon substrate, thus forming a first silicon oxide film throughout on said surface of said silicon substrate by high-density plasma-enhanced chemical vapor deposition;

conducting chemical mechanical polishing on said first silicon oxide film until a surface of said silicon nitride film is exposed;

forming by spin coating or liquid-phase deposition a second silicon oxide film which covers said surface of said silicon nitride film and a surface of said first silicon oxide film to thereby conduct heat treatment in an oxygen atmosphere, serving also to refine said second silicon oxide film;

conducting such anisotropic etching using an etching gas that an etching rate for said first silicon oxide film and said second silicon oxide film may be equal to an etching rate for said silicon nitride film to thereby remove said second silicon oxide film in order to remove each part of said silicon nitride film and said first silicon oxide film;

removing a residue of said silicon nitride film by wet etching; and removing by wet etching a residue of said second silicon oxide film, said thermal-oxidized film, and said first silicon oxide film until said surface of said silicon substrate is exposed.

5. The method for forming said element isolating region according to claim 4, wherein said second silicon oxide film is an inorganic spin-on-glass film or an organic spin-on-glass film made of silicon hydride sesqui-oxide, which is formed by said spin coating.

6. The method for forming said element isolating region according to claim 4, wherein said high-density plasma-enhanced chemical vapor deposition is accompanied by bias sputtering.

7. A method for forming an element isolating region, comprising steps of:

forming a pad oxide film on a surface of silicon substrate by thermal oxidation and forming a silicon nitride film which covers said pad oxide film and then conducting anisotropic etching sequentially on portions of said silicon nitride film and said pad oxide film which exist on a formation-reserved element isolating region to conduct anisotropic etching using said silicon nitride film as a mask in order to form trenches in said surface of said silicon substrate, thus forming a first silicon oxide film throughout on said surface of said silicon substrate by high-density plasma-enhanced chemical vapor;

conducting chemical mechanical polishing on said first silicon oxide film until a surface of said silicon nitride film is exposed;

forming by spin coating or liquid-phase deposition a second silicon oxide film which covers said surface of said silicon nitride film and a surface of said silicon oxide film to thereby conduct heat treatment in an oxygen atmosphere, serving also to refine said second silicon oxide film;

conducting such anisotropic etching using an etching gas that an etching rate for said first silicon oxide film and said second silicon oxide film may be equal to an etching rate for said silicon nitride film to thereby remove said second silicon oxide film in order to remove each part of said silicon nitride film and said first silicon oxide film;

removing a residue of said silicon nitride film by wet etching; and removing by wet etching said pad oxide film and said first silicon oxide film until said surface of said silicon substrate is exposed.

8. The method for forming said element isolating region according to claim 7, wherein said second silicon oxide film is an inorganic spin-on-glass film or an organic spin-on-glass film made of silicon hydride sesqui-oxide, which is formed by said spin coating.

9. The method for forming said element isolating region according to claim 7, wherein said high-density plasma-enhanced chemical vapor deposition is accompanied by bias sputtering.

10. A method for forming an element isolating region, comprising steps of:

forming a pad oxide film on a surface of a silicon substrate by thermal oxidation and forming a silicon nitride film which covers said pad oxide film and then conducting anisotropic etching sequentially on portions of said silicon nitride film and said pad oxide film which exist on a formation-reserved element isolating region to conduct anisotropic etching using said silicon nitride film as a mask in order to form trenches in said surface of said silicon substrate, thus forming a first silicon oxide film throughout on said surface of said silicon substrate by high-density plasma-enhanced chemical vapor deposition;

conducting chemical mechanical polishing on said first silicon oxide film until a surface of said silicon nitride film is exposed;

forming by spin coating or liquid-phase a second silicon oxide film which covers said silicon nitride film and said first silicon oxide film to thereby conduct heat treatment, serving also to refine said second silicon oxide film;

conducting such anisotropic etching using an etching gas that an etching rate for said first silicon oxide film and said second silicon oxide film may be higher than an etching rate for said silicon nitride film to thereby remove said second silicon oxide film in order to remove a part of said silicon nitride film at the same time as removing said first silicon oxide film until a surface of said first silicon oxide film is equal to a surface of said pad oxide film in level;

removing a residue of said silicon nitride film by wet etching; and removing by wet etching said second oxide film, said pad oxide film and said first silicon oxide film until said surface of said silicon substrate is exposed.

11. The method for forming said element isolating region according to claim 10, wherein said second silicon oxide film is an inorganic spin-on-glass film or an organic spin-on-glass film made of silicon hydride sesqui-oxide, which is formed by said spin coating.

12. The method for forming said element isolating region according to claim 10, wherein said high-density plasma-enhanced chemical vapor deposition is accompanied by bias sputtering.

13. A method for forming an element isolating region, comprising steps of:

forming a pad oxide film on a surface of a silicon substrate by thermal oxidation and forming a silicon nitride film which covers said pad oxide film and then conducting anisotropic etching sequentially on portions of said silicon nitride film and said pad oxide film which exist on a formation-reserved element isolating region to conduct anisotropic etching using said silicon nitride film as a mask in order to form trenches in said surface of said silicon substrate, thus forming a first silicon oxide film which has a film thickness smaller than one-half of a minimum width of said trenches by low pressure chemical vapor deposition throughout on said surface of said silicon substrate;

forming by spin coating or liquid-phase deposition a second silicon oxide film which covers a surface of said first silicon oxide film to thereby conduct first heat treatment in an oxygen atmosphere, serving also to refine said second silicon oxide film;

conducting chemical mechanical polishing on said second silicon oxide film and said first silicon oxide film until a surface of said silicon nitride film is exposed;

forming by spin coating or liquid-phase deposition a third silicon oxide film which covers said silicon nitride film and said first silicon oxide film and said second silicon oxide film silicon oxide films to thereby conduct second heat treatment in an oxygen atmosphere, serving also to refine said third silicon oxide film;

conducting such anisotropic etching using an etching gas that an etching rate for said first silicon oxide film, said second silicon oxide film and said third silicon oxide film may be equal to an etching rate for said silicon nitride film to remove said third silicon oxide film and also remove said silicon nitride film, said second silicon oxide film, and said first silicon oxide film until said silicon nitride film is removed completely; and removing by wet etching said pad oxide film, said second silicon oxide film, and said first silicon oxide film until at least said surface of said silicon substrate is exposed.

14. The method for forming said element isolating region according to claim 13, wherein said high-density plasma-enhanced chemical vapor deposition is accompanied by bias sputtering.

15. A method for forming an element isolating region, comprising steps of:

forming a pad oxide film on a surface of a silicon substrate by thermal oxidation and forming a silicon nitride film which covers said pad oxide film and then conducting anisotropic etching sequentially on portions of said silicon nitride film and said pad oxide film which exist on a formation-reserved element isolating region to conduct anisotropic etching using said silicon nitride film as a mask in order to form trenches in said surface of said silicon substrate, thus forming a first silicon oxide film having a film thickness smaller than one-half of a minimum width of said trenches throughout on said surface of said silicon substrate by low pressure chemical vapor deposition;

forming by spin coating or liquid-phase deposition a second silicon oxide film which covers a surface of said first silicon oxide film to thereby conduct first heat treatment in an oxygen atmosphere, serving also to refine said second silicon oxide film;

conducting chemical mechanical deposition on said second silicon oxide film and first silicon oxide film until a surface of said silicon nitride film is exposed;

forming by spin coating or liquid-phase deposition a third silicon oxide film which covers said silicon nitride film and said first silicon oxide film and said second silicon oxide film to thereby conduct second heat treatment, serving also to refine said third silicon oxide film;

conducting such anisotropic etching using an etching gas that an etching rate for said first silicon oxide film, said second silicon oxide film and said third silicon oxide film may be equal to an etching rate for said silicon nitride film to remove said third silicon oxide film and also remove said silicon nitride film, said second silicon oxide film, and said first silicon oxide film so as to leave a part of said silicon nitride film;

removing a residue of said silicon nitride film by wet etching; and removing by wet etching a residue of said third silicon oxide film, said pad oxide film, said second silicon oxide film, and said first silicon oxide film until said surface of said silicon substrate is exposed.

16. The method for forming said element isolating region according to claim 15, wherein said high-density plasma-enhanced chemical vapor deposition is accompanied by bias sputtering.

17. A method for forming an element isolating region, comprising steps of:

forming a pad oxide film on a surface of a silicon substrate by thermal oxidation and forming a silicon nitride film which covers said pad oxide film and then conducting anisotropic etching sequentially on portions of said silicon nitride film and said pad oxide film which exist on a formation-reserved element isolating region to conduct anisotropic etching using said silicon nitride film in order to form trenches in said surface of said silicon substrate, thus forming a first silicon oxide film having a film thickness smaller than one-half of a minimum width of said trenches throughout on said surface of said silicon substrate by low pressure chemical vapor deposition;

forming by spin coating or liquid-phase deposition a second silicon oxide film which covers a surface of said first silicon oxide film to thereby conduct first heat treatment in an oxygen atmosphere, serving also to refine said second silicon oxide film;

conducting chemical mechanical polishing on said second silicon oxide film and first silicon oxide film until a surface of said silicon nitride film is exposed;

forming by spin coating or liquid-phase deposition a third silicon oxide film which covers surfaces of said silicon nitride film and said first silicon oxide film and second silicon oxide film to thereby conduct second heat treatment in an oxygen atmosphere, serving also to refine said third silicon oxide film;

conducting anisotropic etching using such an etching gas that an etching rate for said first silicon oxide film, said second silicon oxide film and said third silicon oxide film may be higher than an etching rate for said silicon nitride film to remove said third silicon oxide film, thus removing each part of said silicon nitride film, said second silicon oxide film, and said first silicon oxide film;

removing a residue of said silicon nitride film by wet etching; and removing by wet etching said pad oxide film, said second silicon oxide film, and said first silicon oxide film until said surface of said silicon substrate is exposed.

18. The method for forming said element isolating region according to claim 17, wherein said high-density plasma-enhanced chemical vapor deposition is accompanied by bias sputtering.

19. A method for forming an element isolating region, comprising steps of:

forming a pad oxide film on a surface of a silicon substrate by thermal oxidation and forming a silicon nitride film which covers said pad oxide film and then conducting anisotropic etching sequentially on portions of said silicon nitride film and said pad oxide film which exist on a formation-reserved element isolating region to conduct anisotropic etching using said silicon nitride film as a mask in order to form trenches in said surface of said silicon substrate, thus forming a first silicon oxide film having a film thickness smaller than one-half of a minimum width of said trenches throughout on said surface of said silicon substrate by low pressure chemical vapor deposition;

forming by spin coating or liquid-phase deposition a second silicon oxide film which covers a surface of said first silicon oxide film to thereby conduct a first heat treatment in an oxygen atmosphere, serving also to refine said second silicon oxide film;

conducting chemical mechanical polishing on said second silicon oxide film and first silicon oxide film until a surface of said silicon nitride film is exposed;

forming by spin coating or liquid-phase deposition a third silicon oxide film which covers surfaces of said silicon nitride film and said first silicon oxide film and said second silicon oxide film to thereby conduct a second heat treatment, serving also to refine said third silicon oxide film;

conducting such anisotropic etching using an etching gas that an etching rate for said first silicon oxide film, said second silicon oxide film and said third silicon oxide film may be higher than an etching rate for said silicon nitride film to remove said third silicon oxide film and remove a part of said silicon nitride film and also remove said second silicon oxide film and said first silicon oxide film until a surface of said second silicon oxide film and an upper edge surface of said first silicon oxide film is equal to a surface of said pad oxide film in level;

removing a residue of said silicon nitride film by wet etching; and removing by wet etching said third oxide film, said pad oxide film, said second silicon oxide film, and said first silicon oxide film until said surface of said silicon substrate is exposed.

20. The method for forming said element isolating region according to claim 19, wherein said high-density plasma-enhanced chemical vapor deposition is accompanied by bias sputtering.

21. A method for forming an element isolating region, comprising steps of:

forming a pad oxide film on a surface of a silicon substrate by thermal oxidation and forming a silicon nitride film which covers said pad oxide film and then conducting anisotropic etching sequentially on portions of said silicon nitride film and said pad oxide film which exist on a formation-reserved element isolating region to then conduct anisotropic etching using said silicon nitride film as a mask in order to form trenches in said surface of said silicon substrate, then forming a thermal-oxidized film on said surface of said silicon substrate including surfaces of said trenches, thus forming a first silicon oxide film throughout on said surface by high-density plasma-enhanced chemical vapor deposition;

conducting chemical mechanical polishing on said first silicon oxide film until a surface of said silicon nitride film is exposed;

forming by spin coating or liquid-phase deposition a second silicon oxide film which covers said surface of said silicon nitride film and a surface of said first silicon oxide film to thereby conduct heat treatment in an oxygen atmosphere, serving also to refine said second silicon oxide film;

conducting such anisotropic etching using an etching gas that an etching rate for said first silicon oxide film and said second silicon oxide film may be equal to an etching rate for said silicon nitride film to thereby remove said second silicon oxide film in order to remove said silicon nitride film and said first silicon oxide film; and removing by wet etching said pad oxide film, said thermal-oxidized film and said first silicon oxide film until at least said surface of said silicon substrate is exposed.

22. A method for forming an element isolating region, comprising steps of:

forming a pad oxide film on a surface of a silicon substrate by thermal oxidation and forming a silicon nitride film which covers said pad oxide film and then conducting anisotropic etching sequentially on portions of said silicon nitride film and said pad oxide film which exist on a formation-reserved element isolating region to conduct anisotropic etching using said silicon nitride film as a mask in order to form trenches in said surface of said silicon substrate, then forming a thermal-oxidized film on said surface of said silicon substrate including surfaces of said trenches, thus forming a first silicon oxide film which has a film thickness smaller than one-half of a minimum width of said trenches by low pressure chemical vapor deposition throughout on said surface of said silicon substrate;

forming by spin coating or liquid-phase deposition a second silicon oxide film which covers a surface of said first silicon oxide film to thereby conduct first heat treatment in an oxygen atmosphere, serving also to refine said second silicon oxide film;

conducting chemical mechanical polishing on said second silicon oxide film and said first silicon oxide film until a surface of said silicon nitride film is exposed;

forming by spin coating or liquid-phase deposition a third silicon oxide film which covers said silicon nitride film and said first silicon oxide film and said second silicon oxide film silicon oxide films to thereby conduct second heat treatment in an oxygen atmosphere, serving also to refine said third silicon oxide film;

conducting such anisotropic etching using an etching gas that an etching rate for said first silicon oxide film, said second silicon oxide film and said third silicon oxide film may be equal to an etching rate for said silicon nitride film to remove said third silicon oxide film and also remove said silicon nitride film, said second silicon oxide film, and said first silicon oxide film until said silicon nitride film is removed completely; and removing by wet etching said pad oxide film, said thermal-oxidized film, said second silicon oxide film, and said first silicon oxide film until at least said surface of said silicon substrate is exposed.

* * * * *